United States Patent
Zylowski

(10) Patent No.: US 7,171,172 B2
(45) Date of Patent: Jan. 30, 2007

(54) METHOD FOR CALIBRATION OF A SIGNAL RECEIVER

(76) Inventor: Sebastian Zylowski, ul. Porzeczkowa 2/4, Zielona Gora 65-001 (PL)

(*) Notice: Subject to any disclaimer, the term of this patent is extended or adjusted under 35 U.S.C. 154(b) by 0 days.

(21) Appl. No.: 10/549,607

(22) PCT Filed: Mar. 23, 2004

(86) PCT No.: PCT/PL2004/000023

§ 371 (c)(1),
(2), (4) Date: Sep. 20, 2005

(87) PCT Pub. No.: WO2004/086638

PCT Pub. Date: Oct. 7, 2004

(65) Prior Publication Data

US 2006/0217092 A1     Sep. 28, 2006

(30) Foreign Application Priority Data

Mar. 24, 2003 (PL) ................................ 359304

(51) Int. Cl.
*H04B 1/04* (2006.01)

(52) U.S. Cl. .............................. 455/127.2; 455/232.1; 375/345

(58) Field of Classification Search .......... 455/127.2, 455/127.1, 219, 232.1; 375/345
See application file for complete search history.

(56) References Cited

U.S. PATENT DOCUMENTS

| 6,993,291 B2 * | 1/2006 | Parssinen et al. ........ 455/67.11 |
| 2004/0063413 A1 * | 4/2004 | Schaffer et al. .......... 455/234.1 |
| 2004/0203472 A1 * | 10/2004 | Chien ......................... 455/68 |

FOREIGN PATENT DOCUMENTS

| WO | WO 00/25445 A | 5/2000 |
| WO | WO 01/24469 | 4/2001 |

* cited by examiner

*Primary Examiner*—Quochien B. Vuong
*Assistant Examiner*—Christian A. Hannon
(74) *Attorney, Agent, or Firm*—Collard & Roe, P.C.

(57) ABSTRACT

A method for calibration of a signal receiver comprising automatic gain control circuits (201, 202, . . . ) from which at least one has unknown characteristic and at least one has a known characteristic, wherein the signal receiver output signal (S 2) is input to a calibration block (203), in which control signals (AGC 1, AGC 2, . . . ) are generated for each automatic gain control circuit (201, 202, . . . ), to set a required level of signal receiver output signal (S 2), according to the invention, is characterized in that the characteristic of each automatic gain control circuit of unknown characteristic is determined by the use of a constant input signal, by connecting to the signal receiver the input signal (S 1) of predetermined parameters, and, preferably in at least one measurement loop controlling the calibration block (203), the gains of automatic gain control circuits of known characteristics are changed by programmably-calculated values and next, using computations preformed in the calibration block (203) on the basis of the input (signal S 1) level and gains of the circuits of known characteristics, points of characteristic of the circuit of unknown characteristic under measurement are determined and written to the memory block (204) as an individual calibration table for the circuit of unknown characteristic under measurement. The invention also refers to a method for calibration of a signal receiver comprising automatic gain control circuits, from which at least two have unknown characteristics. Preferably, the measurement loops are executed with changing the frequency of the signal receiver input signal (S 1). In another embodiment, the measurement loops are executed with changing the level of the signal receiver input signal (S 1).

9 Claims, 4 Drawing Sheets

METHOD FOR CALIBRATION OF A SIGNAL RECEIVER

CROSS REFERENCE TO RELATED APPLICATIONS

Applicant claims priority under 35 U.S.C. §119 of Polish Application No. P 359304 filed Mar. 24, 2003. Applicant also claims priority under 35 U.S.C. §365 of PCT/PL2004/000023 filed March 23, 2004. The international application under PCT article 21(2) was published in English.

TECHNICAL FIELD

The invention relates to a method for calibration of a signal receiver, comprising automatic gain control circuits, from which at least one has unknown characteristic.

BACKGROUND ART

A conventional Automatic Gain Control (AGC) circuit comprises an amplifier, with a gain controlled by a control signal, and a generator of this control signal. However, for the purpose of this description and a simplification of the nomenclature, the AGC term will be used here only for the amplifier controlled with a control signal, which is generated in a separate calibration block.

The elementary characteristic of an AGC circuit is a relation of its gain [dB] to the control signal [V]. This characteristic can be either linear or non-linear. Because of possible lack of precision during the production phase, characteristics of circuits of the same type can differ.

AGC circuits are commonly used in signal receivers, in order to set a required level of signal that is input to a signal-processing module. In receivers that perform frequency conversion (for example, demodulation), two AGC circuits are usually used—the first for control of the level of a high frequency input signal and the second for control of the level of a lower frequency input signal.

Two AGC circuits are also used when more precise control of a received signal is required or when one of the AGC circuits has insufficient regulation range.

Signal receivers often need to determine the power of the input signal. It can be calculated on the basis of the level of the output signal of the last AGC circuit and individual gains of successive AGC circuits.

However, because of production imprecision, characteristics of AGC circuits are deformed, and a measurement based on a general (theoretical) characteristic of a circuit is burdened with an error. This error can be minimized by calibrating all AGC circuits used in the receiver, to determine their characteristics precisely. The calibration process can be performed during production phase, where it is possible to connect test signals of a predetermined level to the receiver. Obviously, the time of calibration influences the production efficiency and the final cost of the device. Therefore, the calibration should be as simple and fast as possible.

An example of a signal receiver, which requires such calibration, is a cable modem. The structure of a conventional cable modem is presented in FIG. 1. A high frequency (radio frequency) input signal S_RF is received by the tuner 101, for example a Microtune MT2040 chip, which converts the signal to an intermediate frequency signal S_IF. Next, the signal is passed through a SAW filter 102, for example with the center frequency of 43.75 MHz. Next, it is input to an intermediate frequency amplifier 103, for example a Microtune MT1233 chip. Its output signal S_IF is connected to a processor (which may be a demodulator) 104 of the cable modem, for example an ST Microelectronics STV0396 chip. The tuner 101 gain is controlled with the AGC_RF signal, while the gain of the IF amplifier 103 is controlled with the AGC_IF signal.

A commonly used specification, which defines the functionality of a cable modem, is DOCSIS (Data-Over-Cable Service Interface Specification). DOCSIS version 1.1 requires that a cable modem should be able to determine the level of the received signal with the accuracy of +/−3 dB. Such a high level of accuracy requires the modem to be calibrated, in order to accurately and precisely determine the characteristics of AGC circuits.

A typical method of cable modem calibration is presented in the PCT application publication No. WO 01/24469, entitled "Method and system for estimating input power in a cable modem network." The calibration involves inputting signals of various levels and frequencies and storing their corresponding AGC values. Such a method of calibration is ineffective, since it is performed fox 12 signal levels only, while the pain for the remaining values can be calculated on the basis of the measured neighboring values. In addition, the method is suitable to a single AGC circuit only, while the method of the present invention is applicable to devices with two or more AGO circuits.

NATURE OF THE INVENTION

According to the present invention, in a method for calibration of a signal receiver comprising automatic gain control circuits, from which at least two have unknown characteristics, wherein the signal receiver output signal is passed to a calibration block, in which control signals are generated for each automatic gain control circuit to set a required level of the signal receiver output signal, the characteristic of at least one automatic gain control circuit of unknown characteristic is measured by the use of a variable input signal, by setting a constant gain of the remaining automatic gain control circuits and, preferably in at least one measurement loop controlling the calibration block, the parameters of the signal receiver input signal are changed by programmably-calculated values and next, using computations preformed in the calibration block on the basis of the signal receiver input signal level, points of characteristic of the circuit of unknown characteristic under measurement are determined and written to the memory block as an individual calibration table for the circuit of unknown characteristic under measurement, and next the characteristics of the remaining automatic gain control circuits of unknown characteristics are measured by the use of a constant input signal, by connecting to the signal receiver an input signal of predetermined parameters and, preferably in at least one measurement loop controlling the calibration block, the gains of automatic gain control circuits of known characteristics are changed by programmably-calculated values and next, using computations preformed in the calibration block on the basis of the signal receiver input signal level and gains of circuits of known characteristics, points of characteristic of the circuit of unknown characteristic under measurement are determined and written to the memory block as an individual calibration table for the circuit of unknown characteristic under measurement.

While measuring the characteristic of an automatic gain control circuit of unknown characteristic by the use of a variable input signal, pairs of values can be written to the calibration table created for this circuit, defining the relative level of the input signal for a predetermined gain of the remaining automatic gain control circuits and the corresponding control signal of the circuit of unknown characteristic under measurement.

While measuring the characteristic of an automatic gain control circuit of unknown characteristic by the use of a variable input signal, the measurement loop steps can be executed twice.

While measuring the characteristic of an automatic gain control circuit of unknown characteristic by the use of a constant input signal, pairs of values can be written to the calibration table created for this circuit, defining the relative level of the input signal for a predetermined gain of the remaining automatic gain control circuits and the corresponding control signal of the circuit of unknown characteristic under measurement.

While measuring the characteristic of an automatic gain control circuit of unknown characteristic by the use of a constant input signal, the measurement loop steps can be executed twice.

While measuring the characteristic of an automatic gain control circuit of unknown characteristic by the use of a variable input signal, in the measurement loop the frequency of the signal receiver input signal can be changed.

While measuring the characteristic of an automatic gain control circuit of unknown characteristic by the use of a variable input signal, in the measurement loop the level of the signal receiver input signal can be changed.

While measuring the characteristic of an automatic gain control circuit of unknown characteristic by the use of a constant input signal, the measurement loops can be executed for different frequencies of the signal receiver input signal.

While measuring the characteristic of an automatic gain control circuit of unknown characteristic by the use of a constant input signal, the measurement loops can be executed for different levels of the signal receiver input signal.

According to another method for calibration of a signal receiver comprising automatic gain control circuits, from which at least one has unknown characteristic and at least one has a known characteristic, wherein the signal receiver output signal is input to a calibration block, in which control signals are generated for each automatic gain control circuit to set a required level of the signal receiver output signal, the characteristic of each automatic gain control circuit of unknown characteristic is measured by the use of a constant input signal, by connecting to the signal receiver the input signal of predetermined parameters and, preferably in at least one measurement loop controlling the calibration block, the gains of automatic gain control circuits of known characteristics are changed by programmably-calculated values and next, using computations preformed in the calibration block on the basis of the signal receiver input signal level and gains of circuits of known characteristics, points of characteristic of the circuit of unknown characteristic under measurement are determined and written to the memory block as an individual calibration table for the circuit of unknown characteristic under measurement.

Pairs of values can be written to the calibration table created for the circuit of unknown characteristic under measurement, defining the relative level of the input signal for a predetermined gain of the remaining automatic gain control circuits and the corresponding control signal of the circuit of unknown characteristic under measurement.

The steps of the measurement loop can be executed twice.

The measurement loops can be executed for different frequencies of the signal receiver input signal.

The measurement loops can be executed for different levels of the signal receiver input signal.

The presented calibration method is noticeably faster than the methods known from the prior art. It allows controlling, programmably, the accuracy of measurement of the AGC circuit characteristic. To calibrate a circuit with a linear characteristic, it allows automatically narrowing the number of loop measurements to a required minimum. Similarly, efficient calibration can be performed for AGC circuits with non-linear characteristics.

BRIEF DESCRIPTION OF DRAWINGS

The object of this invention is shown in implementation examples in the enclosed drawing, in which.

BEST MODE OF THE REALIZATION

In the following description, for purposes of explanation rather than limitation, specific details are set forth such as the particular architecture, interfaces, techniques, etc., in order to provide a thorough understanding of the present invention. For purposes of simplicity and clarity, detailed descriptions of well-known devices, circuits, and methods are omitted so as not to obscure the description of the present invention with unnecessary detail.

The method of calibration of a signal receiver comprising automatic gain control circuits of unknown characteristics, according to the present invention, is described with the use of an exemplary signal receiver having at least two AGC circuits of unknown characteristics.

Figure 2:
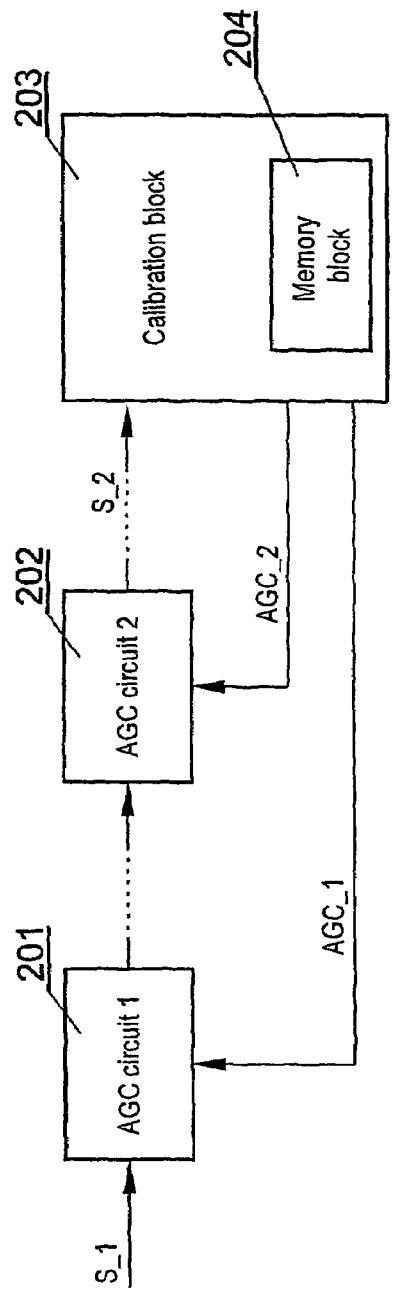
FIG. 2 shows a general structure of a signal receiver.

The structure of such receiver is presented in FIG. 2. It comprises a first automatic gain control circuit 201 and a second automatic gain control circuit 202 and a calibration block 203 with a memory block 204. The circuits are connected with each other in a standard way, which does not require detailed description.

An input signal S_1 is connected to the first automatic gain control circuit 201 controlled with the AGC_1 signal. The input signal S_1, attenuated or amplified, passes through a set of signal-processing circuits (not shown in the drawing) and next it is input to the input of the circuit controlled with the AGC_2 signal. There, the signal is attenuated or amplified, and then it passes through another set of signal-processing circuits (not shown in the drawing) and, as the output signal S_2 of the signal receiver, it reaches the calibration block 203, which controls the levels of signals AGC_1 and AGC_2.

The calibration block 203 allows controlling AGC_1 and AGC_2 signals such that the receiver output signal S_2 has a desired level. It also allows setting a specific value of one of the AGC_1 or AGC_2 signals, while the value of the second signal is set automatically so that a desired attenuation or amplification is achieved.

The calibration block 203, comprises a memory block 204 as an internal component, or alternatively it may be connected to an external memory block. The memory block is used for storing calibration results.

Figure 1:
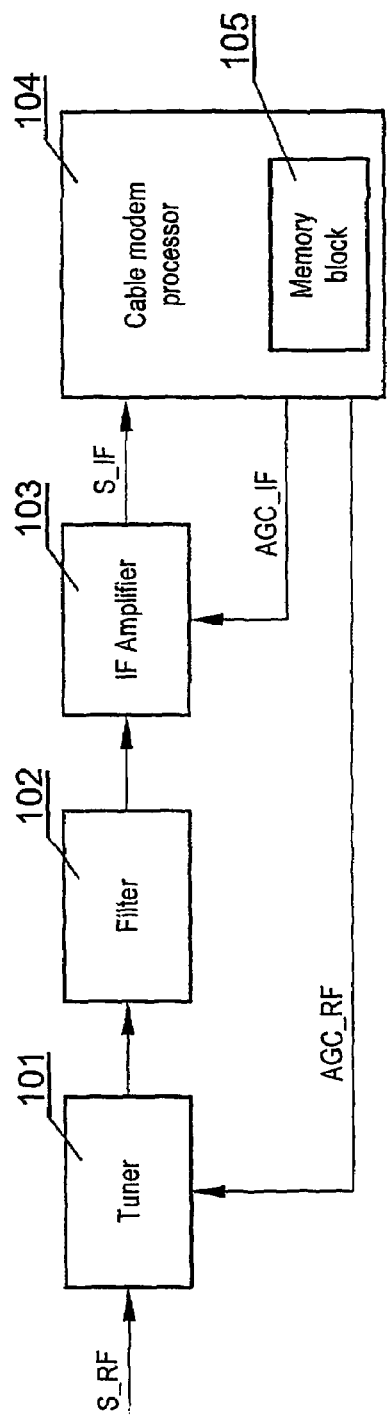
FIG. 1 shows a structure of a typical cable modem, as an example of a signal receiver, for the purpose of the prior art description and presentation of preferred embodiments of the invention.

The preferred embodiments of methods of the present invention are described with reference to the cable modem shown in FIG. 1, where the IF amplifier 103 is treated as the first automatic gain control circuit and the tuner 101 is treated as the second automatic gain control circuit.

Figure 3:
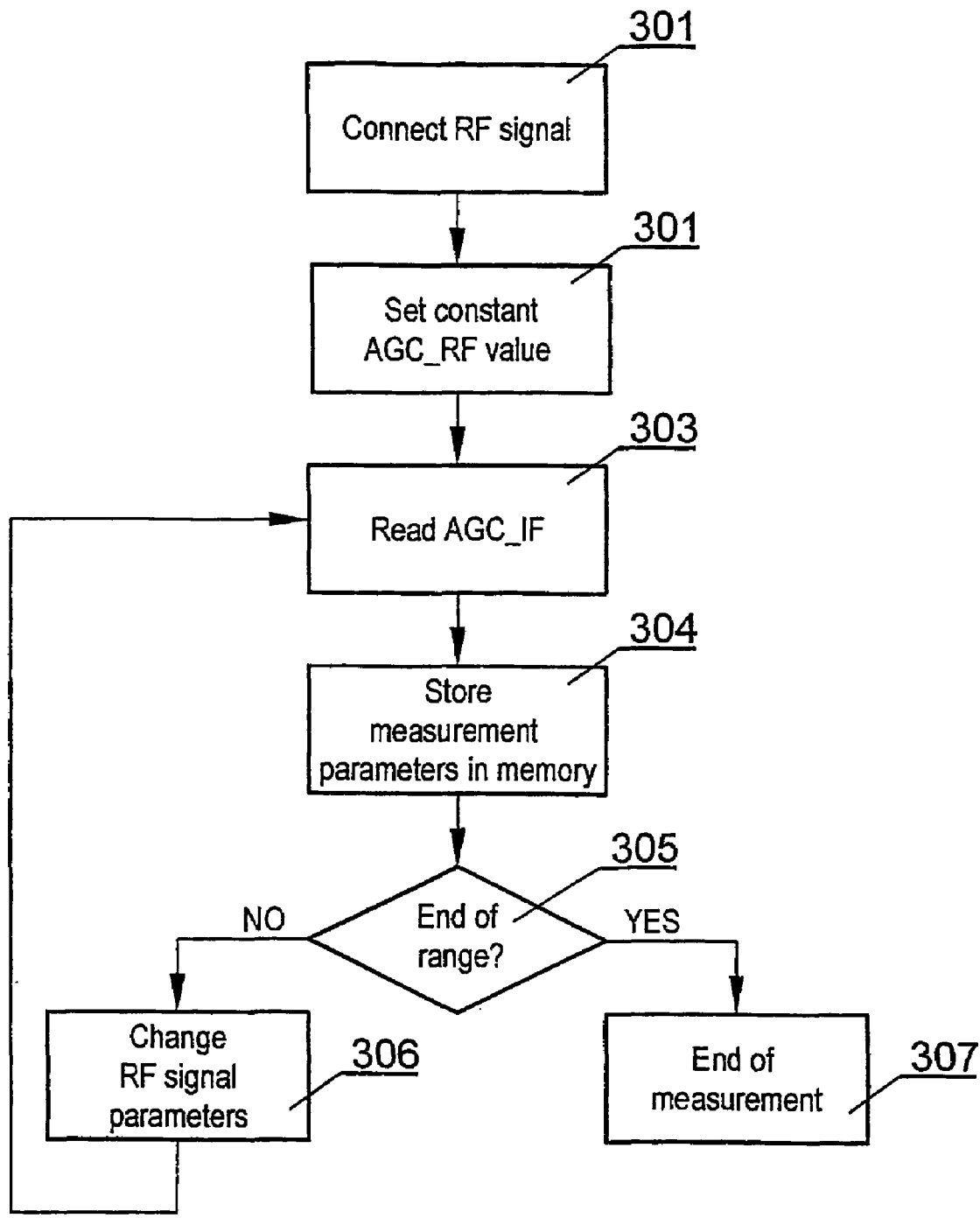
FIG. 3 shows a procedure of calibration of AGC circuits shown in FIG. 1 by the use of a variable input signal.

A procedure for measuring the characteristic of the first automatic gain control circuit (according to the example—the IF amplifier 103 in FIG. 1) is shown in FIG. 3, described below. The characteristic is determined by the use of a variable input signal.

In the first step 301 of the procedure, a signal S_RF of a known level is input to the signal receiver. Next, in step 302, the gain of the second AGC circuit (according to the example—the tuner 101 in FIG. 1) is set to a constant value AGC_RF. Next, a measurement loop is started. In step 303, the value of the AGC_IF signal is read. Next, in step 304, a pair of values defining the input signal level and the value of the AGC_IF signal ($P_{RF}$, AGC_IF) is written to the memory block 105. In the next step 305 it is checked if the whole set of measurements has already been performed. The next measurement, in step 306, is performed for another value ($P_{RF}$) of the input signal S_RF, which results in automatic adjustment of the AGC_IF signal. After executing a series of such measurements, in step 307, the measurement of the characteristic of the IF amplifier 103 is complete.

While determining the characteristic of the IF amplifier 103, one measurement is performed for such level of input signal S_RF (marked as level_high in the further description), for which the gain of the path from the tuner 101 to the processor 104 of the cable modem is assumed to be zero. The input signal S_RF of level_high level corresponds to an AGC_IF signal marked in the further description as AGC_IF_high.

It is known, from the specification of the IF amplifier 103 used in this example, that it has a linear characteristic. Due to this fact, the steps of the measurement loop are executed only twice. During the second execution of the measurement loop, a signal S_RF of a lower level is input, marked as level_low, and the corresponding AGC_IF_low signal value is read.

The two points allow to define the linear characteristic of the IF amplifier 103, using the following equation:

$$K_{IF}(\text{AGC\_IF}) = (\text{AGC\_IF\_high} - \text{AGC\_IF}) * \frac{\text{level\_high} - \text{level\_low}}{\text{AGC\_IF\_high} - \text{AGC\_IF\_low}}$$

A person skilled in the art may also easily measure the characteristic of a nonlinear circuit, using the procedure shown in FIG. 3, by performing two or more measurements.

If the characteristic of the measured circuit changes with frequency, it may be necessary to perform the procedure shown in FIG. 3 for signals of various frequencies. In such a case, the input signal frequency needs to be changed in the measurement loop.

The characteristic of the second AGC circuit (which in this example is the tuner 101) can be determined by the following equation (in which values are given in decibels):

$$P_{IF} = K_{RF} + K_{IF} + P_{RF}$$

where:
$P_{IF}$ is the power of the IF amplifier 103 output signal
$P_{RF}$ is the power of the tuner 101 input signal
$K_{RF}$ is the tuner 101 gain
$K_{IF}$ is the IF amplifier 103 gain The formula can be converted to:

$$P_{RF} = K_{RF} + K_{IF} - P_{IF}$$

Since the IF amplifier 103 output level is constant throughout the whole calibration procedure, only the values of RF and IF stage gains are necessary to perform measurements.

The characteristic of the IF amplifier has been already defined, therefore only the characteristic of the RF stage is left to be defined.

In order to simplify future computations, the above formula can be modified to:

$$P_{RF} = \text{Signal}_{RF} + K_{IF}$$

Assuming that:

$$\text{Signal}_{RF} = K_{RF} - P_{IF}$$

Since the levels of the input signal S_RF and the output signal S_IF are constant, the sum of the tuner 101 gain and the IF amplifier 103 gain is also constant:

$$K_{RF} + K_{IF} = \text{const}$$

If the levels of the input signal S_RF and the output signal S_IF are constant, a change of one of the gains results in a change of the second gain in the opposite direction:

$$\Delta K_{RF} = -\Delta K_{IF}$$

Taking into account that the power of the output signal S IF is constant, the following formula is achieved:

$$\Delta \text{Signal}_{RF} = -\Delta K_{IF}$$

This relationship is used to perform accurate calibration, which can be performed with a constant input signal.

Figure 4:
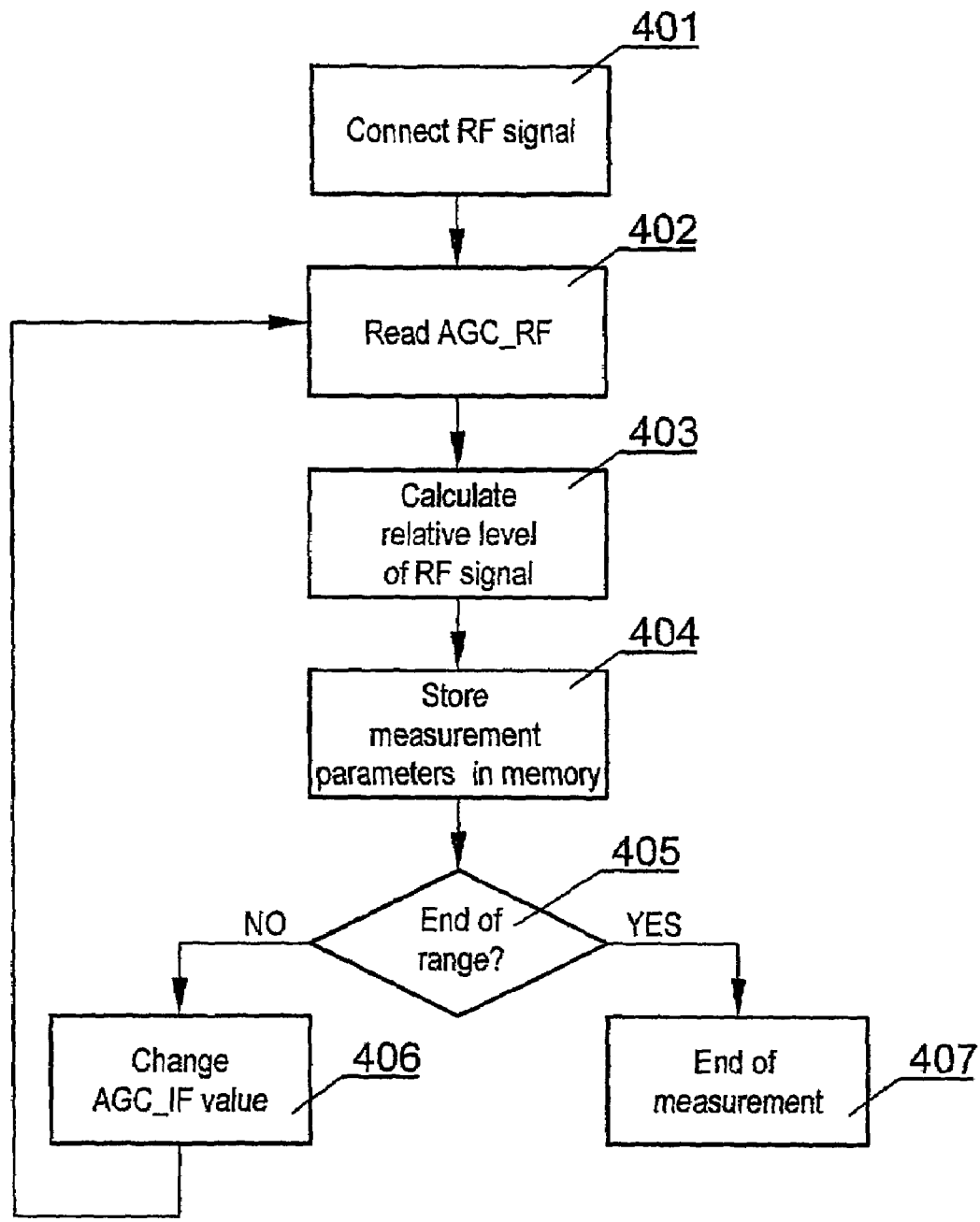
FIG. 4 shows a procedure of calibration of AGC circuits shown in FIG. 1 by the use of a constant input signal.

The calibration procedure using the above formula is shown in FIG. 4. In the first step 401 of the procedure, the input signal S_RF of a known level is input to the signal receiver and the gains of the IF and RF stages are adjusted. After adjusting the AGC control signals, the calibration block takes control of the AGC_IF signal so that it can modify the IF stage gain. In first step 402 of the measurement loop, the value of the AGC_RF signal is read. Next, in step 403, a relative level of the input signal S_RF is calculated. It is the level which corresponds to the previously read AGC_RF value, for a zero gain of the IF amplifier 103:

$$\text{Signal}_{RF}(\text{AGC\_RF}) = P_{RF} - K_{IF}(\text{AGC\_IF})$$

Next, in step 404, a pair of values ($\text{Signal}_{RF}$, AGC_RF) is written to the memory block 105. In the next step 405, it is checked if the whole set of measurements has been already performed. The next measurement, in step 406, is executed for another value of gain $K_{IF}$(AGC_IF), which results in automatic adjustment of the AGC_RF signal. After a series of measurements have been performed, the measurement of the circuit characteristic is complete in step 407.

The range of measurements and successive measurement points may be arbitrarily defined, with relation to the precision and the range of the tuner 101 characteristic to be measured. For example, the gain of the IF amplifier 103 can be set to a medium value for the first measurement, further measurements can be executed for decreased gain and when the gain reaches a minimum, it can be returned to the medium value and increased to a maximum. The measurements can be performed, for example, with a 1 dB precision.

For those skilled in the art it will be obvious that if a circuit with a linear characteristic is measured by the method shown in FIG. 4, it is enough to perform only two measurements. Basing on these measurements, the equation of the characteristic can be defined, similarly as for the IF amplifier 103 characteristic.

However, it may occur that the above methods will be not sufficient to determine the full characteristic of the circuit, for example, when the range of the input signal S_RF is greater than the broadest range of the gain of one of the AGC circuits.

In such a case, more measurements loops should be executed, for various levels of the input signal S_RF. For example, if the range of the input signal S_RF is 30 dB and the regulation range of the IF amplifier 103 is 20 dB, it is necessary to perform two measurements. For example, the first measurement should be performed for the input signal S_RF of a minimum level and the second for the input signal S_RF of a level 15 dB higher.

It may also be necessary to perform measurements for signals of various frequencies, if the characteristic of the measured amplifier changes with frequency.

Figure 5:
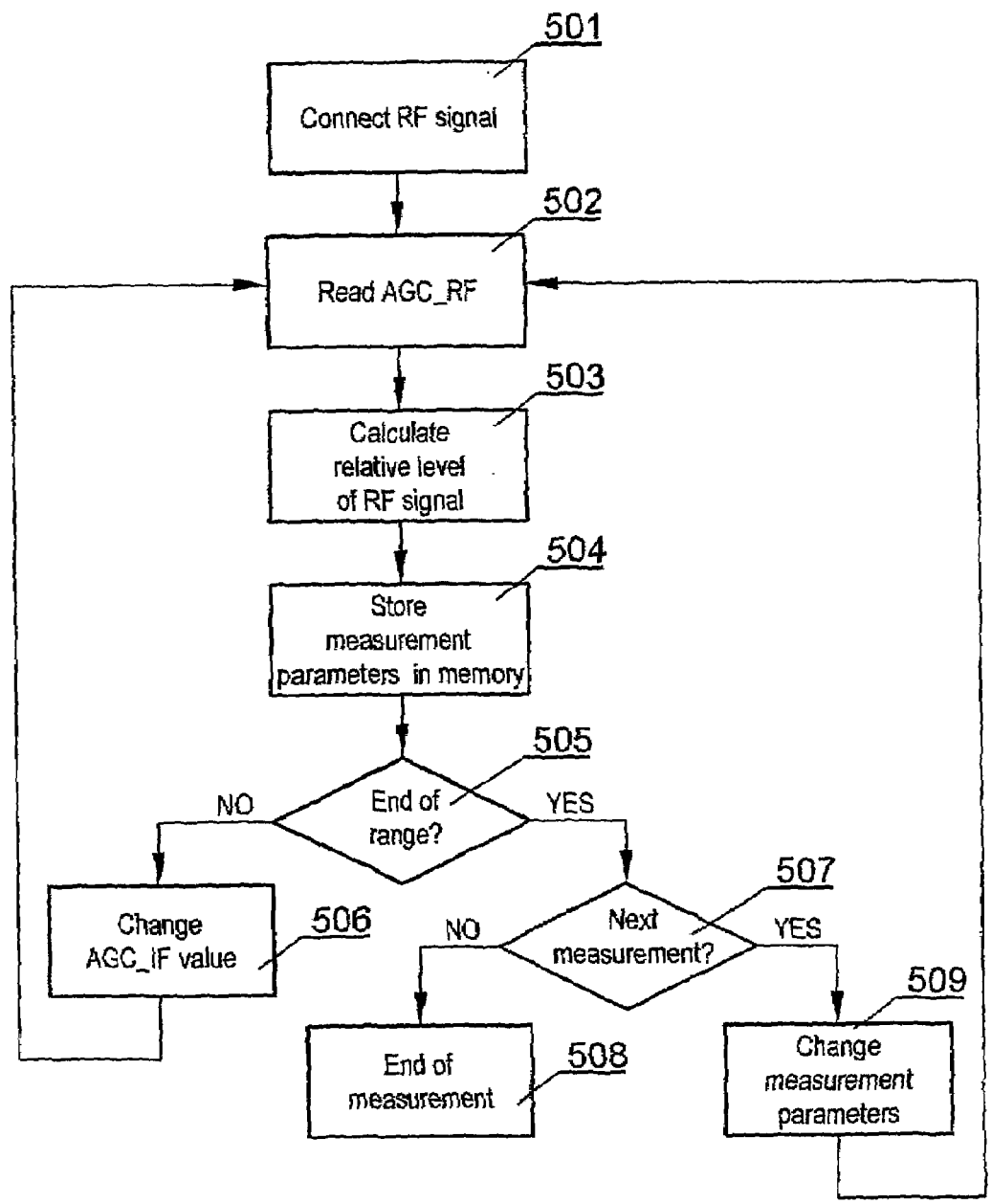
FIG. 5 shows a procedure of calibration of a signal receiver by the use of a constant input signal and several measurement loops.

The calibration procedure with several measurement loops is shown in FIG. 5. The steps 501–506 correspond to steps 401–406 of FIG. 4. Additionally, after the measurement loop is complete, in step 507 it is checked if another measurement loop should be executed. If not, the measurement of the characteristic is complete in step 508. If another measurement is to be executed then, in step 509, measurement parameters are changed. For example, the level or the frequency of the input signal can be adjusted. Next, the following measurement loop can be executed for different parameters of the input signal S_RF.

An exemplary calibration procedure of the cable modem shown in FIG. 1 can be performed with 8 consecutive measurements, presented in the following table:

| Input signal S RF | | |
|---|---|---|
| Frequency | Level | Measurement description |
| 500 MHz | 50 dBuV | Determining the linear characteristic of the IF |
| 500 MHz | 70 dBuV | amplifier 103 |
| 500 MHz | 50 dBuV | Determining the characteristic of the tuner 101 for a high gain |
| 500 MHz | 70 dBuV | Determining the characteristic of the tuner 101 for a low gain |
| 100 MHz | 50 dBuV | Determining the characteristic of the tuner 101 for a high gain |
| 100 MHz | 70 dBuV | Determining the characteristic of the tuner 101 for a low gain |
| 820 MHz | 50 dBuV | Determining the characteristic of the tuner 101 for a high gain |
| 820 MHz | 70 dBuV | Determining the characteristic of the tuner 101 for a low gain |

The first two measurements are used to determine the linear characteristic of the IF amplifier 103 for an input signal of the frequency of 500 MHz.

The next measurements are executed in order to determine the non-linear characteristic of the tuner 101 for three different frequencies. First, an input signal S_RF of a low level is connected, allowing measurement in the range corresponding to a higher gain. Then an input signal S_RF of a higher level is connected, allowing measurement in the range corresponding to a lower gain.

The steps of the measurement loop can be executed with changing the gain of the IF amplifier 103 by, for example, 1 dB.

After the calibration procedure if finished, and the tables of the input signals S_RF levels corresponding to the AGC_RF values are created, the input signal S_RF level can be defined on the basis of AGC_RF and AGC_IF values, using the following equation:

$$P_{RF} = \text{Signal}_{RF}(\text{AGC\_RF}) + K_{IF}(\text{AGC\_IF})$$

The level of the input signal S_RF corresponding to a given AGC_RE value is calculated with the use of the measurement results table, written to the memory block 204 during the calibration procedure.

As shown above, the calibration procedure according to the present invention is performed to determine the level of an input signal S_RF that corresponds to a specific gain of the tuner 101, defined by the AGC_IF signal, for assumed zero gain of the IF amplifier 103.

The calibration loop is executed for various values of the gain of the IF amplifier 103, which allows to measure a set of characteristic points of the tuner 101, which are written as an individual calibration table to the memory block 105.

In order to calculate the input signal S_RF value, the stored value of the input signal S_RF, related to a particular AGC_RF signal value, has to be read from the memory and corrected by the the gain of the IF amplifier 103, which is defined by the AGC_IF signal.

Due to the fact that the calibration procedure according to the present invention is executed with a constant level of the input signal S_RF and changing only the gain of the IF amplifier 103, the presented method is faster than the methods in which the input signal S_RF level is changed.

The change of gain of the IF amplifier 103 can be performed automatically, and internally in the receiver, so the whole calibration procedure can be executed quickly. The precision of the characteristic of the tuner 101 can also be controlled automatically by adjusting the step of changing the IF amplifier 103 gain.

The calibration block 203 shown in FIG. 2 can be a separate block or a part of a larger circuit, for example a processor.

The method according to the present invention is designed for a signal receiver comprising at least two automatic gain control circuits AGC of unknown characteristic. The characteristic of one of the automatic gain control circuits should be determined using the procedure shown in FIG. 3. Then, as the characteristic of this circuit is known, the characteristics of the remaining circuits can also be determined using the procedure shown in FIG. 3 or, preferably, using the procedure shown in FIG. 4 or FIG. 5.

If the signal receiver comprises several automatic gain control circuits, of which one has a known characteristic, the characteristics of the circuits of unknown characteristic can be determined using, preferably, only the procedure shown in FIG. 4.

For those skilled in the art it will be obvious that the presented method can be modified in order to allow calibration of signal receivers comprising more than two automatic gain control circuits.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

The invention claimed is:

1. A method for calibrating a signal receiver comprising a plurality of serially connected automatic gain control circuits, from which at least two of said gain circuits have unknown gain characteristics, the method comprising the following steps:
   (a) inputting a signal receiver output signal to a calibration block;
   (b) generating control signals for each automatic gain control circuit to set a required level of the signal receiver output signal;
   (c) individually measuring a gain characteristic of at least one automatic gain control circuit of unknown characteristic by using a first procedure comprising:
      (i) initializing the calibration block to set a required constant level of the signal receiver output signal throughout the whole first procedure;
      (ii) setting constant gains of the remaining automatic gain control circuits; and
      (iii) performing a series of measurements in at least one measurement loop controlling the calibration block, where for each measurement in the series, the parameters of a signal receiver input signal (S_1) are changed by programmably-calculated values within a predefined range;
   (d) storing the gain characteristic of the circuit of unknown characteristic under measurement in the memory block as a calibration table, which specifies a series of pairs of values describing the input signal level and the value of the control signal of the circuit under measurement;
   (e) individually measuring the gain characteristics of the remaining automatic gain control circuits of unknown characteristics by the use of a second procedure that comprises:
      (i) initializing the calibration block to set a requited constant level of the signal receiver output signal throughout the whole procedure,
      (ii) connecting to the signal receiver an input signal (S_1) of predetermined parameters;
      (iii) performing a series of measurements in at least one measurement loop controlling the calibration block, where for each measurement the gains of automatic gain control circuits of known characteristics are changed by programmably-calculated values within a predefined range;
   (f) calculating the relative level of the input signal as the difference between the signal receiver input signal level and gains of the circuits of known characteristics; and
   (g) storing the gain characteristic of the remaining circuit of unknown characteristic under measurement in the memory block as a calibration table, which specifies a series of pairs of values describing the relative level of the input signal and the value of the control signal of the circuit under measurement.

2. A method of claim 1, wherein while measuring the gain characteristic of an automatic gain control circuit of unknown characteristic, the series of measurements of the first procedure includes two measurements.

3. A method of claim 1, wherein while measuring the characteristic of an automatic gain control circuit of unknown characteristic by the use of the first procedure, in the measurement loop the frequency of the signal receiver input signal (S_1) is changed.

4. A method of claim 1, wherein while measuring the characteristic of an automatic gain control circuit of unknown characteristic by the use of the first procedure, in the measurement loop the level of the signal receiver input signals (S_1) is changed.

5. A method of claim 1, wherein while measuring the characteristic of an automatic gain control circuit of unknown characteristic by the use of the second procedure, the measurement loops are executed for different frequencies of the signal receiver input signal (S_1).

6. A method of claim 1, wherein while measuring the characteristic of an automatic gain control circuit of unknown characteristic by the use of the second procedure, the measurement loops are executed for different levels of the signal receiver input signal (S_1).

7. A method for calibration of a signal receiver comprising serially connected automatic gain control circuits, from which at least one gain control circuit has an unknown gain characteristic and at least one gain control circuit has a known gain characteristic, comprising the following steps:
   (a) inputting the signal receiver output signal to a calibration block, in which control signals are generated for each automatic gain control circuit to set a required level of the signal receiver output signal;
   (b) individually measuring a gain characteristic of each automatic gain control circuit of unknown characteristic by the use of a procedure which comprises the following steps:
      (i) initializing the calibration block to set a required constant level of the signal receiver output signal throughout the whole procedure;
      (ii) connecting to the signal receiver an input signal (S_1) of predetermined parameters;
      (iii) performing a series of measurements in at least one measurement loop controlling the calibration block (203), where for each measurement the gains of automatic gain control circuits of known characteristics are changed by programmably-calculated values within a predefined range;
   (c) calculating the relative level of the input signal as the difference between the signal receiver input signal (S1) level and gains of circuits of known characteristics; and
   (d) storing the gain characteristic of the circuit of unknown characteristic under measurement in the memory block as a calibration table, which specifies a series of pairs of values describing the relative level of the input signal and the value of the control signal of the circuit under measurement.

8. A method of claim 7, wherein the measurement loops are executed for different frequencies of the signal receiver input signal (S_1).

9. A method of claim 7, wherein the measurement loops are executed for different levels of the signal receiver input signal (S_1).

* * * * *